US 8,387,458 B2

(12) United States Patent
Aida et al.

(10) Patent No.: US 8,387,458 B2
(45) Date of Patent: Mar. 5, 2013

(54) SENSOR HAVING IMPROVED THERMAL STABILITY

(75) Inventors: Kazuhiko Aida, Shinjuku-ku (JP);
Katsumi Hashimoto, Shinjuku-ku (JP);
Toshiaki Mori, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 652 days.

(21) Appl. No.: 12/495,012

(22) Filed: Jun. 30, 2009

(65) Prior Publication Data
US 2010/0005886 A1    Jan. 14, 2010

(30) Foreign Application Priority Data

Jul. 11, 2008   (JP) ................................. 2008-181039

(51) Int. Cl.
*G01P 15/12*    (2006.01)
(52) U.S. Cl. ......................................... 73/514.33; 338/2
(58) Field of Classification Search ............... 73/514.33, 73/514.34; 338/2, 5
See application file for complete search history.

(56) References Cited

U.S. PATENT DOCUMENTS

| | | | | | |
|---|---|---|---|---|---|
| 5,138,414 | A * | 8/1992 | Shinohara | ...................... | 257/417 |
| 5,336,918 | A * | 8/1994 | Ipposhi et al. | ................. | 257/419 |
| 6,892,579 | B2 * | 5/2005 | Ohtoyo et al. | ............. | 73/514.33 |
| 7,222,536 | B2 * | 5/2007 | Ikeda et al. | ................. | 73/514.33 |
| 7,281,427 | B2 * | 10/2007 | Mori | ........................... | 73/514.33 |
| 7,322,241 | B2 * | 1/2008 | Kai | ............................. | 73/514.33 |
| 7,331,230 | B2 * | 2/2008 | Takeyari et al. | ............ | 73/514.33 |
| 7,461,559 | B2 * | 12/2008 | Takizawa | ........................ | 73/777 |
| 7,481,113 | B2 * | 1/2009 | Seto | ............................... | 73/514.33 |
| 7,500,395 | B2 * | 3/2009 | Mori | ........................... | 73/514.33 |
| 7,540,198 | B2 * | 6/2009 | Ichikawa | ......................... | 73/754 |
| 7,629,263 | B2 * | 12/2009 | Seto | ............................... | 438/736 |
| 7,838,951 | B2 * | 11/2010 | Kimino | ......................... | 257/414 |
| 2009/0223292 | A1 * | 9/2009 | Hatano et al. | .............. | 73/514.33 |

FOREIGN PATENT DOCUMENTS

| JP | 2006-098321 | * | 4/2006 |
|---|---|---|---|
| JP | 2008-082953 | * | 4/2008 |

OTHER PUBLICATIONS

U.S. Appl. No. 12/424,054, filed Apr. 15, 2009.

* cited by examiner

*Primary Examiner* — Helen C. Kwok
(74) *Attorney, Agent, or Firm* — Oblon, Spivak, McClelland, Maier & Neustadt, L.L.P.

(57) ABSTRACT

The invention provides a sensor comprising a frame, a plurality of beams extending inwardly from said frame, a weight portion supported by the beams, a piezoelectric-resistor formed on each beam and an insulating layer that covers the piezoelectric-resistor. The piezoelectric-resistor has at least one bend, and a metal wiring is located on the insulting layer positioned at the bend. The metal wiring is connected to the bend via at least two contact holes formed in the insulating layer. Contact holes are formed in the insulating layer positioned at both ends of the piezoelectric-resistor, and a bridge circuit wiring is connected to the piezoelectric-resistor via the contact holes.

3 Claims, 11 Drawing Sheets

SENSOR HAVING IMPROVED THERMAL STABILITY

ART FIELD

The present invention relates generally to a sensor for sensing physical quantities such as acceleration and its fabrication process, and more particularly to a sensor that uses a piezoelectric-resistor as a sensor device and its fabrication process.

BACKGROUND ART

In recent years, there has been a rapid progress in the development of small-format sensors harnessing the MEMS (micro-electromechanical systems) technology, and sensors adapted to sense physical quantities such as acceleration have been used in various applications inclusive of cellular phones and game machines, with their applications now under study. Such sensors are fabricated using an SOI wafer having a triple-layer structure of, for instance, a silicon layer/silicon oxide layer/silicon layer. A typical sensor comprises a frame having an opening formed in such a way as to hollow out an SOI wafer, a displaceable weight supported on this frame via a plurality of beams and a piezoelectric-resistor located at each beam. And as external force is applied to the weight to trigger off displacement, it causes the beams to bend in association with that displacement, and the resistance of the piezoelectric-resistor located at the beam to change incidental to the amount of bending of the beam. Then, that resistance change is sensed to sense physical quantities such as acceleration.

To make the sensitivity of such sensors high, it is preferable that a short piezoelectric-resistor is located at a stress concentration site. However, a problem with this is that only with the use of the short piezoelectric-resistor, there are increasing power consumptions, because voltage is applied to the piezoelectric-resistor during driving. To solve that problem, there is now a sensor developed wherein a plurality of short piezoelectric-resistors are connected in series by a high-concentration diffusion layer (JP(A) 2006-98321).

In the sensor set forth in JP(A) 2006-98321, however, each piezoelectric-resistor is formed by diffusing a low concentration of impurities in a silicon substrate, and the high concentration diffusion layer adapted to connect a plurality of piezoelectric-resistors in series, too, is a silicon substrate with a high concentration of impurities diffused in it; so there is Joule heat generated from the piezoelectric-resistors and high concentration diffusion layer by the voltage applied to the piezoelectric-resistor during driving. Further in the sensor disclosed in JP(A) 2006-98321, each piezoelectric-resistor and the high concentration diffusion layer are covered with an insulating layer; in other words, that sensor has a structure less likely to release off heat. For this reason, the generated Joule heat gives rise to thermal expansion of the beams, wirings located on the beams, the silicon oxide layer, and the silicon layer. This in turn triggers off a temporal change in the output value of the sensor, offering a problem that the sensor's reliability goes worse.

The sensor disclosed in JP(A) 2006-98321 is fabricated by a process comprising (1) the step of diffusing a low concentration of impurities in a silicon substrate to form a piezoelectric-resistor, (2) the step of diffusing a high concentration of impurities in the silicon substrate to form a high-concentration diffusion layer, (3) the step of providing an insulating layer over the piezoelectric-resistor and high-concentration diffusion layer and providing a contact hole in it, and (4) the step of forming wirings: the need for four cycles of photolithography results in low productivity. Another problem is that wirings for electrically connecting multiple piezoelectric-resistors in series lie on the high-concentration diffusion layer alone, and as defects occur at this side, it directly means malfunction of the sensor itself.

DISCLOSURE OF THE INVENTION

The present invention has for its object to provide a sensor that can show its own high-sensitivity sensor function in a stable way and a process for the fabrication of such a sensor.

According to the invention, such an object is accomplishable by the provision of a sensor, comprising a frame, a plurality of beams extending inwardly from said frame, a weight portion supported by said beams, a piezoelectric-resistor formed on each beam and an insulating layer that covers said piezoelectric-resistor, wherein said piezoelectric-resistor has at least one bend; a metal wiring is located on said insulting layer positioned at said bend; said metal wiring is connected to said bend via at least two contact holes formed in said insulating layer; contact holes are formed in said insulating layer positioned at both ends of said piezoelectric-resistor; and a bridge circuit wiring is connected to the piezoelectric-resistor via said contact holes.

In another embodiment of the invention, a diffusion resistance layer is located at the piezoelectric-resistor just below said contact holes.

With such an inventive sensor wherein the metal wiring is located at and connected onto the insulating layer positioned at the bend of the piezoelectric-resistor, it is possible to keep Joule heat from being generated at the bend of the piezoelectric-resistor, and effectively release off Joule heat generated at the piezoelectric-resistor covered with the insulating layer. It is thus possible to prevent temporal fluctuations of the output values of the sensor, and achieve high-sensitivity sensor function in a stable way. When the diffusion resistance layer is located at the piezoelectric-resistor just below the contact holes, on the other hand, it is possible to reduce the contact resistance of the piezoelectric-resistor with the metal wiring or bridge circuit wiring, thereby holding back the generation of Joule heat.

The present invention also provides a process for the fabrication of a sensor comprising a frame, a plurality of beams extending inwardly from said frame, a weight portion supported by said beams, a piezoelectric-resistor formed on each beam and an insulating layer that covers said piezoelectric-resistor, which process comprises the first step of diffusing impurities to form a piezoelectric-resistor having at least one bend; the second step of forming an insulating layer in such a way as to cover the piezoelectric-resistor, and forming contact holes in the bend and both ends of the piezoelectric-resistor; and the third step of forming a metal wiring on said insulating layer positioned at the bend for connection to the piezoelectric-resistor and, at the same time, forming a bridge circuit wiring for connection to the piezoelectric-resistor via said contact holes positioned at both ends of the piezoelectric-resistor.

In another embodiment of the invention, at said second step, the insulating layer is formed, and then a high concentration of impurities is diffused into the piezoelectric-resistor exposed in the contact holes, thereby forming a diffusion resistance layer.

In such an inventive sensor fabrication process, it is the first, the second and the third step that are needed for the formation of the piezoelectric-resistors, and at the third step in particular, the metal wiring and the bridge circuit wiring can simultaneously be formed. In other words, the conventional step of diffusing high concentrations of impurities into a silicon substrate for the formation of a high-concentration diffusion layer may be dispensed with. It is thus possible to slash the fabrication costs involved and fabricate a high-performance sensor in a stable way.

EMBODIMENTS FOR CARRYING OUT THE INVENTION

Figure 1:
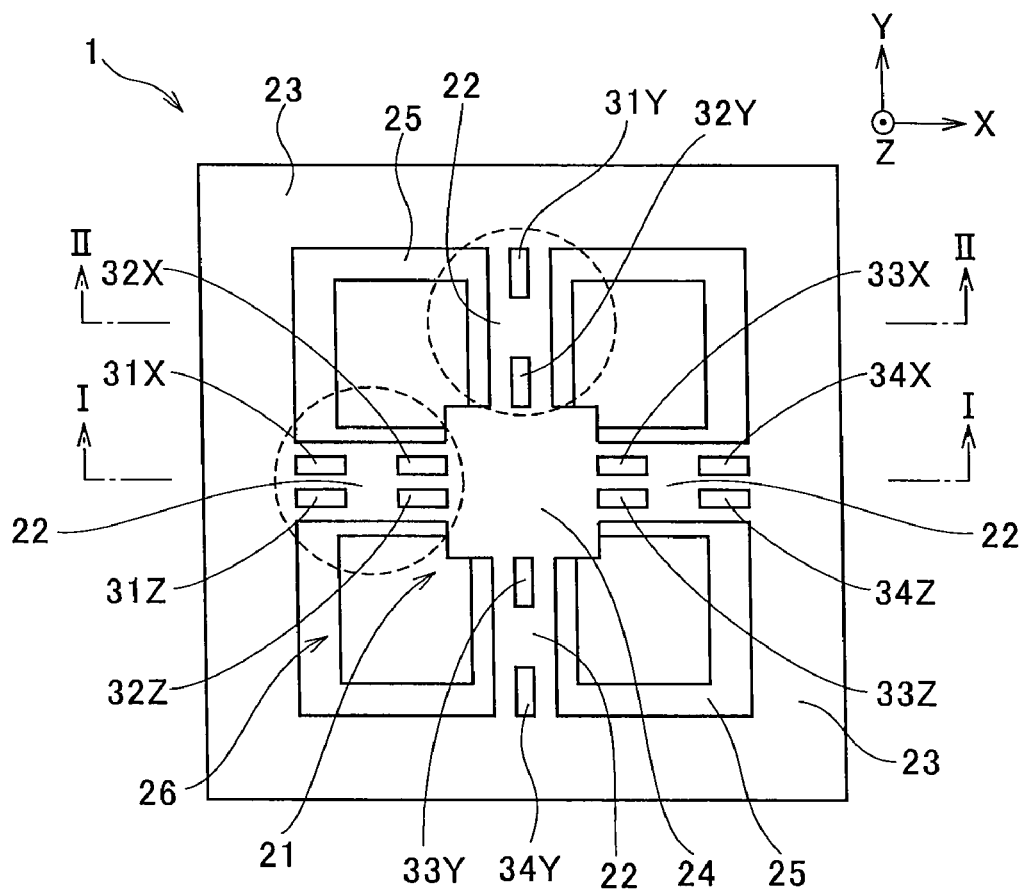
FIG. 1 is a plan view of one embodiment of the inventive sensor.
Figure 2:
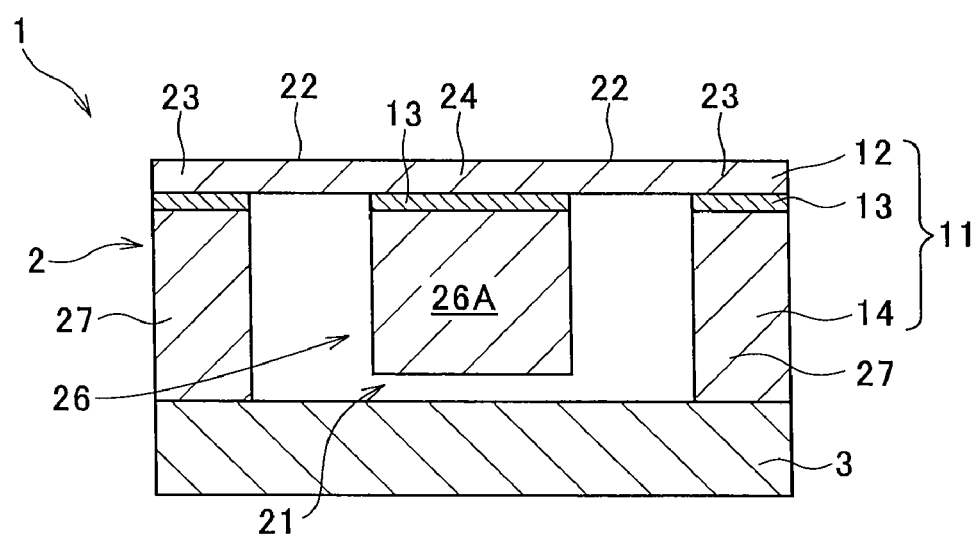
FIG. 2 is a sectional view of the sensor of FIG. 1, as taken on line I-I.
Figure 3:
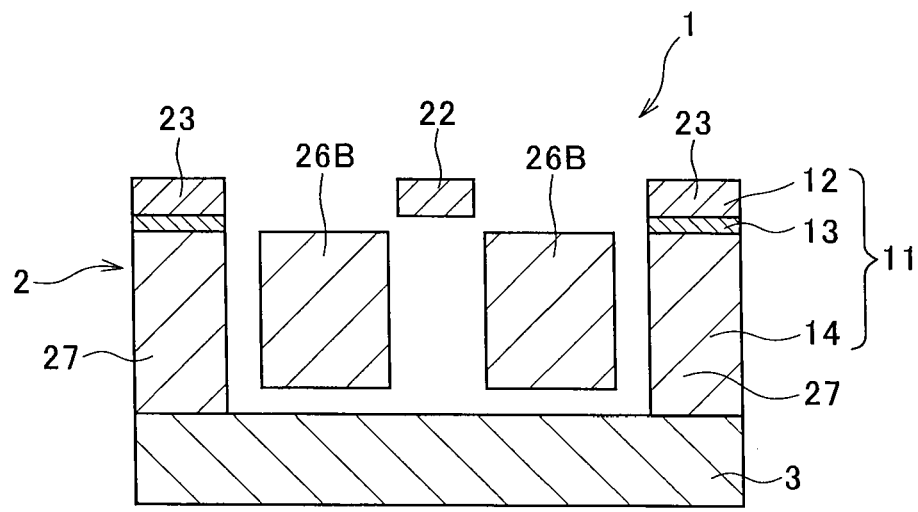
FIG. 3 is a sectional view of the sensor of FIG. 1, as taken on line II-II.

Some embodiments of the invention are now explained with reference to the accompanying drawings.
[Sensor]
FIG. 1 is a plan view of an acceleration sensor that is one embodiment of the inventive sensor; FIG. 2 is a sectional view of the sensor of FIG. 1 as taken on line I-I; and FIG. 3 is a sectional view of the sensor of FIG. 1 as taken on line II-II. Referring to FIGS. 1, 2 and 3, a sensor shown generally at 1 comprises a sensor body 2 and a support substrate 3 bonded to the sensor body 2. The sensor body 2 comprises an SOI (silicon on insulator) substrate 11 having a triple-layer structure wherein a silicon oxide layer 13 is sandwiched between a silicon layer 12 (active layer silicon) and a silicon layer 14 (substrate silicon).

The silicon layer 12 (active layer silicon) forming a part of the sensor body 2 comprises a weight joint 24 forming a weight portion 21, four beams 22 for supporting the weight joint 24, a frame 23 and four windows 25 surrounded with each beam 22 and the frame 23. The four beams 22 have four piezoelectric-resistors 31X, 32X, 33X, 34X for sensing external force in the X-axis direction, four piezoelectric-resistors 31Y, 32Y, 33Y, 34Y for sensing external force in the Y-axis direction, and four piezoelectric-resistors 31Z, 32Z, 33Z, 34Z for sensing external force in the Z-axis direction. The piezoelectric-resistors located in this way provide bridge circuits, each with four piezoelectric-resistors in the respective directions, as will be described later.

The silicon layer 14 (substrate silicon) forming a part of the sensor body 2 comprises a weight 26 forming the weight portion 21 and a frame 27 positioned around the weight 26 via an opening. The weight 26 is thinner than the frame 27, and comprises a root 26A and four projections 26B that extend between a cross form of beams 22 (windows 25). And the root 26A of the weight 26 is bonded to the weight joint 24 of the silicon layer 12 (active layer silicon) via the silicon oxide layer 13 to form the weight portion 21.

The support substrate 3 forming a part of the sensor 1 may be formed of, for instance, a glass plate, a silicon plate, a SUS plate, a metal plate such as an Invar (Fe-36% Ni alloy) plate, and an insulating resin plate at an appropriate thickness of about 50 to 1,000 μm. It should here be noted that the inventive sensor may be built up of the sensor body 2 alone, i.e., without recourse to the support substrate 3; in this case, it may be mounted directly on a package substrate.

As external force in the X-, Y-, or Z-axis direction (see FIG. 1) acts on the sensor 1, especially the weight portion 21 supported by the four beams 22, there is a displacement in the weight portion 21, which in turn causes the beams 22 to bend so that the external force acting on the weight portion 21 is sensed by the piezoelectric-resistors.

Each piezoelectric-resistor forming a part of the inventive sensor is now explained in more details.

Figure 4:
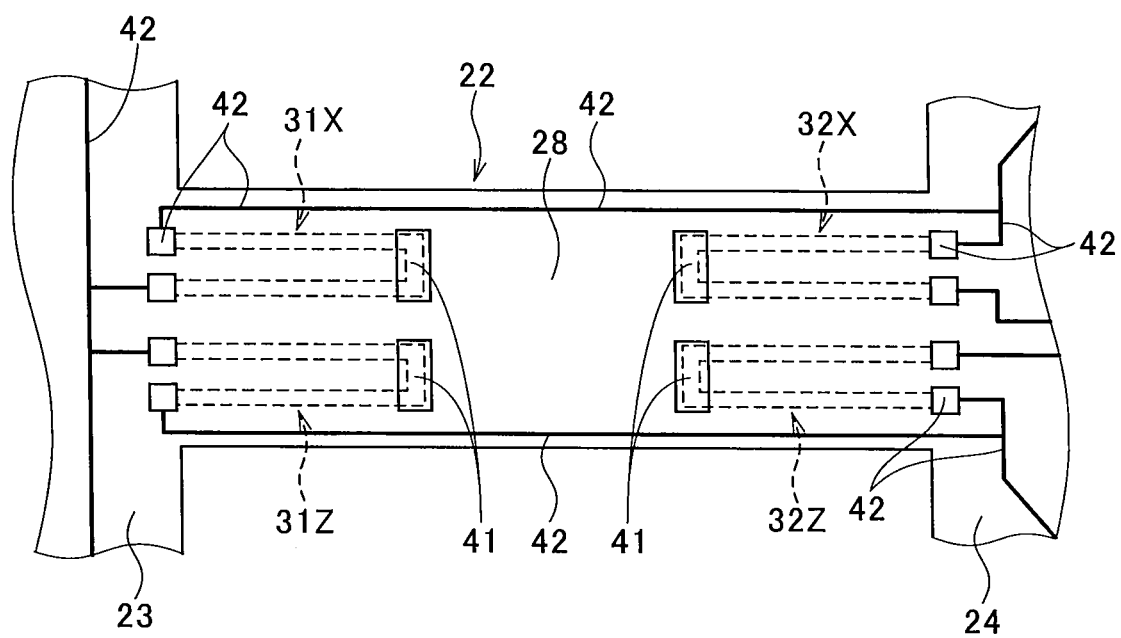
FIG. 4 is an enlarged plan view of a site encircled in the sensor of FIG. 1.
Figure 5:
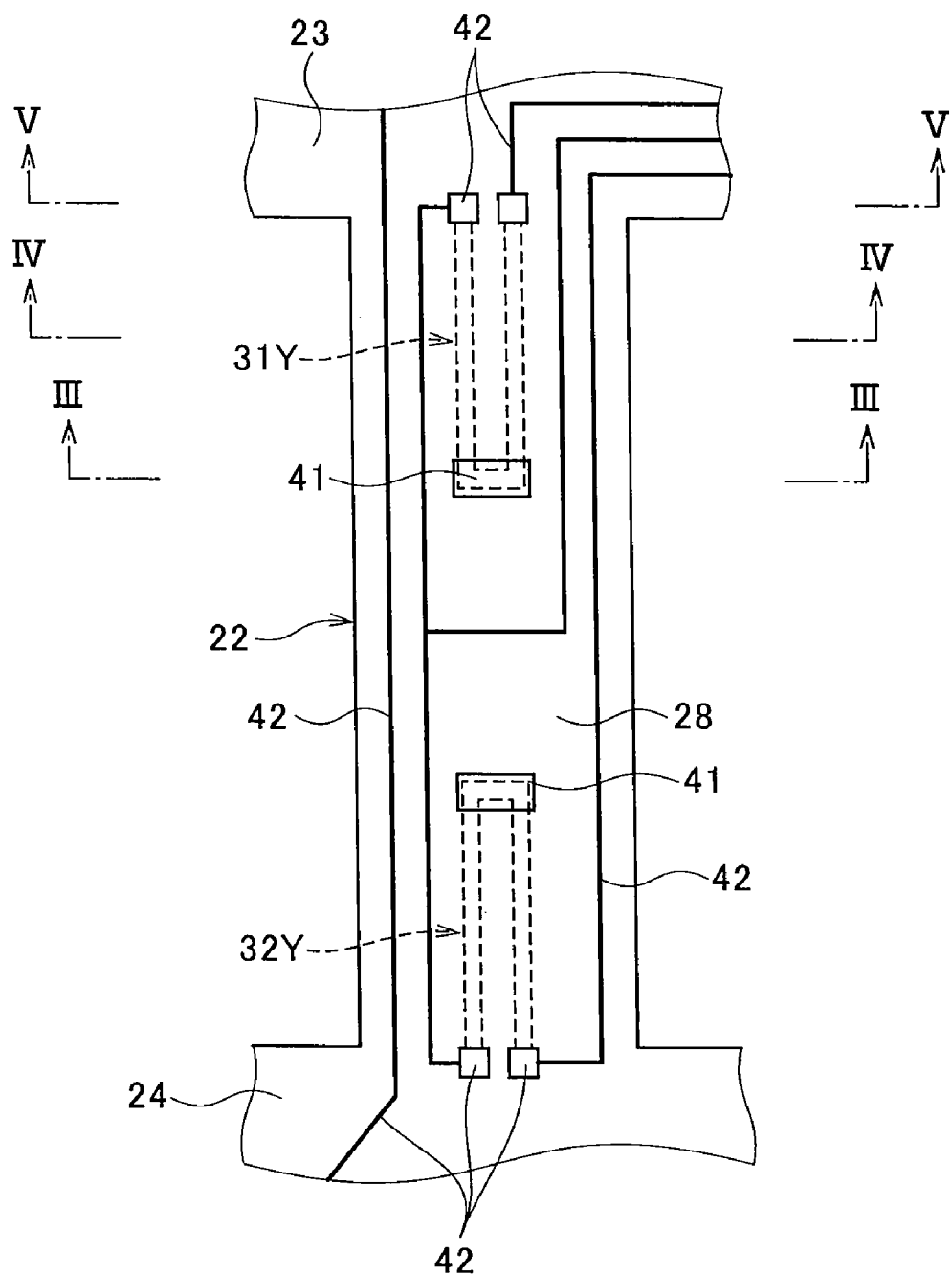
FIG. 5 is an enlarged plan view of a site encircled in the sensor of FIG. 1.

FIGS. 4 and 5 are enlarged plan views of two sites encircled in FIG. 1. FIG. 4 is illustrative of the piezoelectric-resistors 31X and 32X for sensing external force in the X-axis direction and the piezoelectric-resistors 31Z and 32Z for sensing external force in the Z-axis direction, and FIG. 5 is illustrative of the piezoelectric-resistors 31Y and 32Y for sensing external force in the Y-axis direction. Referring specifically to FIG. 4, the piezoelectric-resistors 31X and 32X as well as 31Z and 32Z are located at symmetrical positions about the center line of the beam 22, and referring specifically to FIG. 5, the piezoelectric-resistors 31Y and 32Y are located on the center line of the beam 22. Note here that the respective piezoelectric-resistors have a common structure. In what follows, therefore, the piezoelectric-resistors forming a part of the inventive sensor will be explained typically with reference to the piezoelectric-resistor 31Y.

Figure 6:
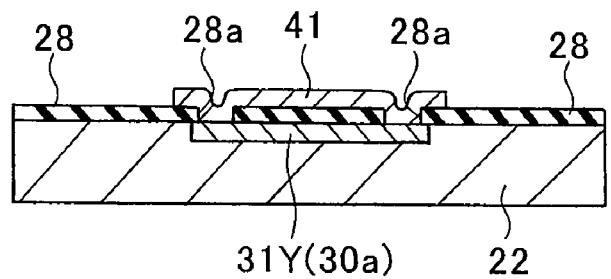
FIG. 6 is an enlarged sectional view as taken on line III-III of FIG. 5.
Figure 7:
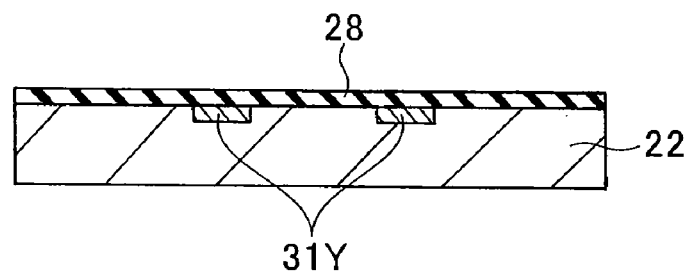
FIG. 7 is an enlarged sectional view as taken on line IV-IV of FIG. 5.
Figure 8:
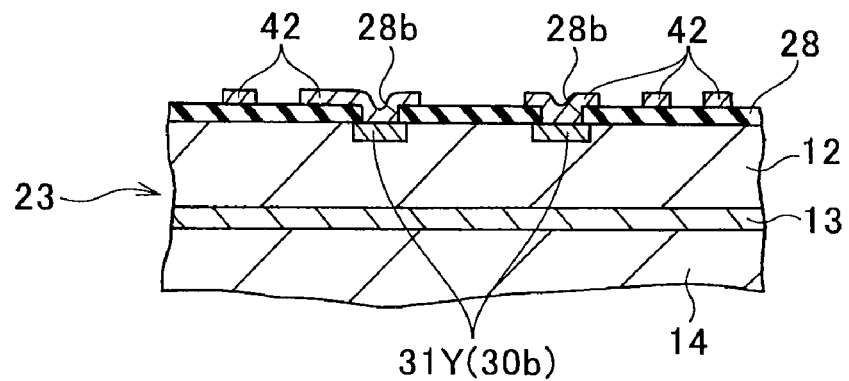
FIG. 8 is an enlarged sectional view as taken on line V-V of FIG. 5.

FIGS. 6, 7 and 8 are enlarged sectional views of FIG. 5 as taken on lines III-III, IV-IV and V-V, respectively. In the invention, the piezoelectric-resistor 31Y has one bend 30a, and a metal wiring 41 is located on an insulating layer 28 positioned at that bend 30a. The insulating layer 28 has also a bridge circuit wiring 42 located on it.

Figure 9:
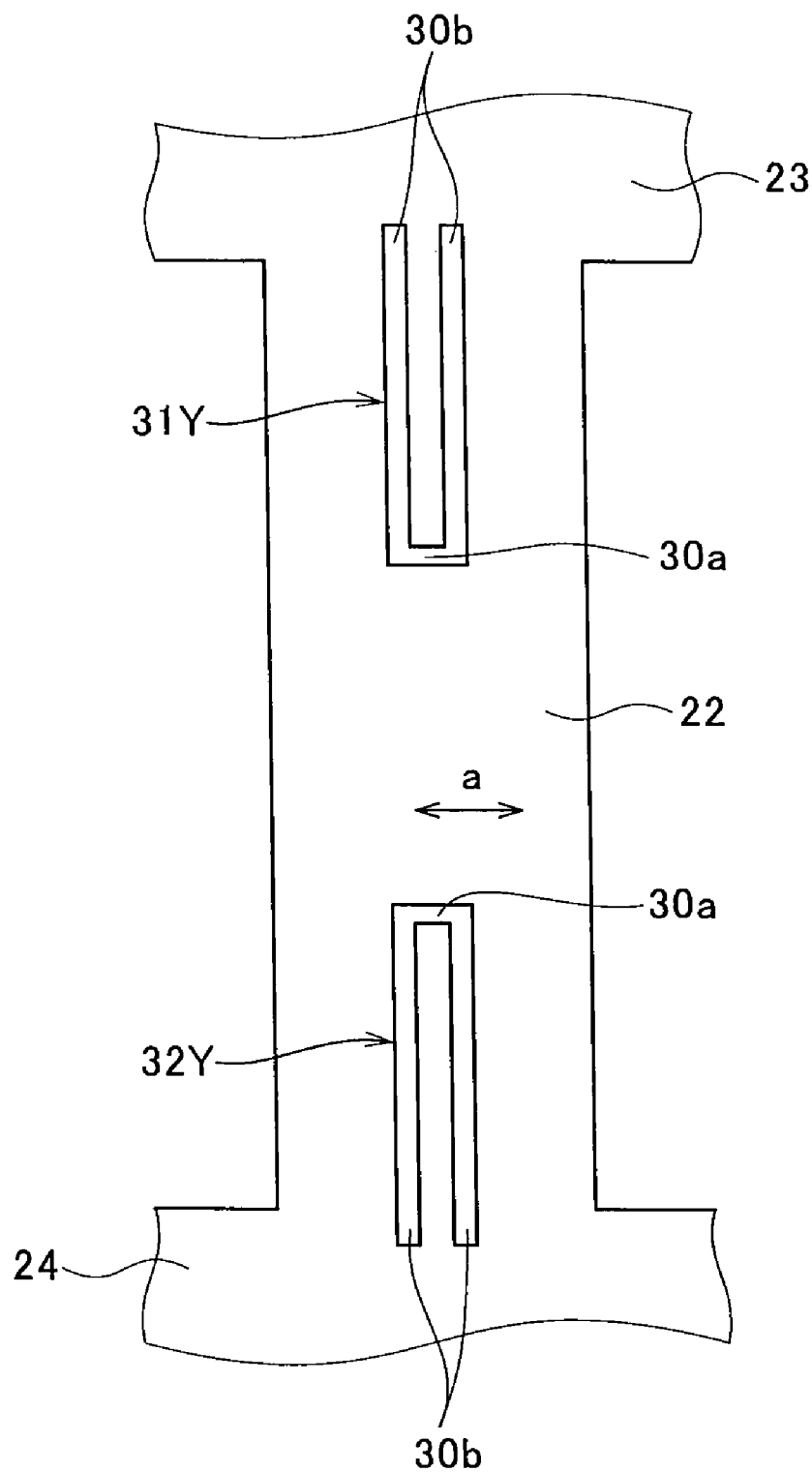
FIG. 9 is a view similar to FIG. 5, showing a piezoelectric-resistor having one bend, which is located at a beam.

The piezoelectric-resistor 31Y is a low-concentration diffusion layer formed by diffusing such impurities as boron and phosphorus into the beam 22 (silicon layer 12 (active layer silicon)), and the surface impurity concentration is on the order of, for instance, $10^{17}$ to $10^{19}$ atm/cm$^3$. FIG. 9 is a view similar to FIG. 5, showing the piezoelectric-resistors 31Y and 32Y at the beam 22, each with one bend 30a. More specifically, it shows an arrangement having none of the insulating layer 28, metal wiring 41 and bridge circuit wiring 42. The piezoelectric-resistor 31Y having such bend 30a may optionally be sized; for instance, two stripes may each have a width of 0.2 to 10 μm and a length of 10 to 100 μm, and the bend 30a may have a length (the direction indicated by a double arrow a in FIG. 9) of 2 to 20 μm and a width of 0.2 to 10 μm. In particular, each stripe should have a width of at least 3 μm in consideration of the effect on holding back fluctuations upon current conduction, and up to 10 μm in consideration of preventing incidental detection of physical quantities (for instance, twisting) on other axes (other axis sensitivity).

Figure 10:
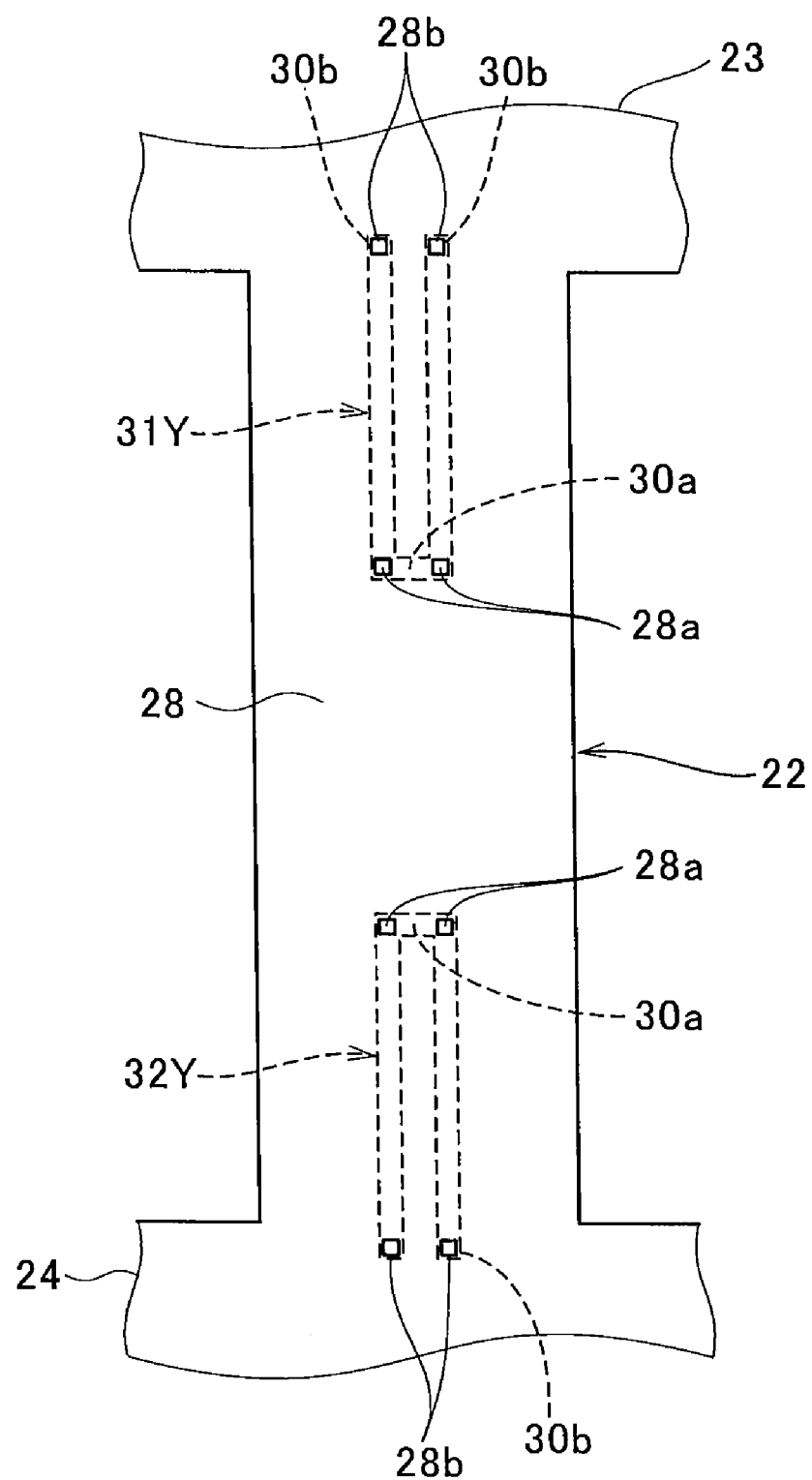
FIG. 10 is a view similar to FIG. 5, showing an insulating layer at a beam.

The silicon layer 28 is formed on the silicon layer 12 (active layer silicon) forming a part of the sensor body 2 in such a way as to cover the piezoelectric-resistor 31Y. Note here that the insulating layer 28 is not shown in FIGS. 1, 2 and 3. At the insulating layer 28, two contact holes 28a are formed on the bend 30a of the piezoelectric-resistor 31Y, and contact holes 28b are provided such that they lie at both ends 30b of the piezoelectric-resistor 31Y. FIG. 10 is a view similar to FIG. 5, showing the insulating layer 28 at the beam 22. More specifically, it shows an arrangement having none of the metal wiring 41 and bridge circuit wiring 42. Such insulating layer 28 may be formed of, for instance, a silicon dioxide layer having a thickness optionally selected from the range of about 50 to about 500 nm.

The metal wiring 41 is located on the insulating layer 28 positioned at the bend 30a, and connected to the bend 30a of the piezoelectric-resistor 31Y via the two contact holes 28a. The planar shape of the metal wiring 41 may be identical with that of the bend 30a or, alternatively, the metal wiring 41 may optionally be sized and configured in such a way as to have an area ratio of 80 to 200% to the bend 30a. As the planar shape of the metal wiring 41 is less than 80% of that of the bend 30a, it fails to achieve such advantages of the invention as will be described later. Exceeding 200% is not preferable because the thermal expansion coefficient difference between the silicon layer 12 (active layer silicon) and the metal wiring 41 causes the beam 22 to warp or gives rise to offset voltage. Such metal wiring 41, for instance, may be formed of aluminum, an alloy composed mainly of aluminum, copper, titanium, titanium nitride, and a metal material comprising a multilayer film of these.

The bridge circuit wiring 42 is located on the insulating layer 28 such that the bridge circuit is created with four piezoelectric-resistors in each axis direction, and connected to both ends 30b of the piezoelectric-resistor 31Y via two contact holes 28b. Such bridge circuit wiring 42 may be formed of the same metal material as that for the metal wiring 41.

Figure 11:
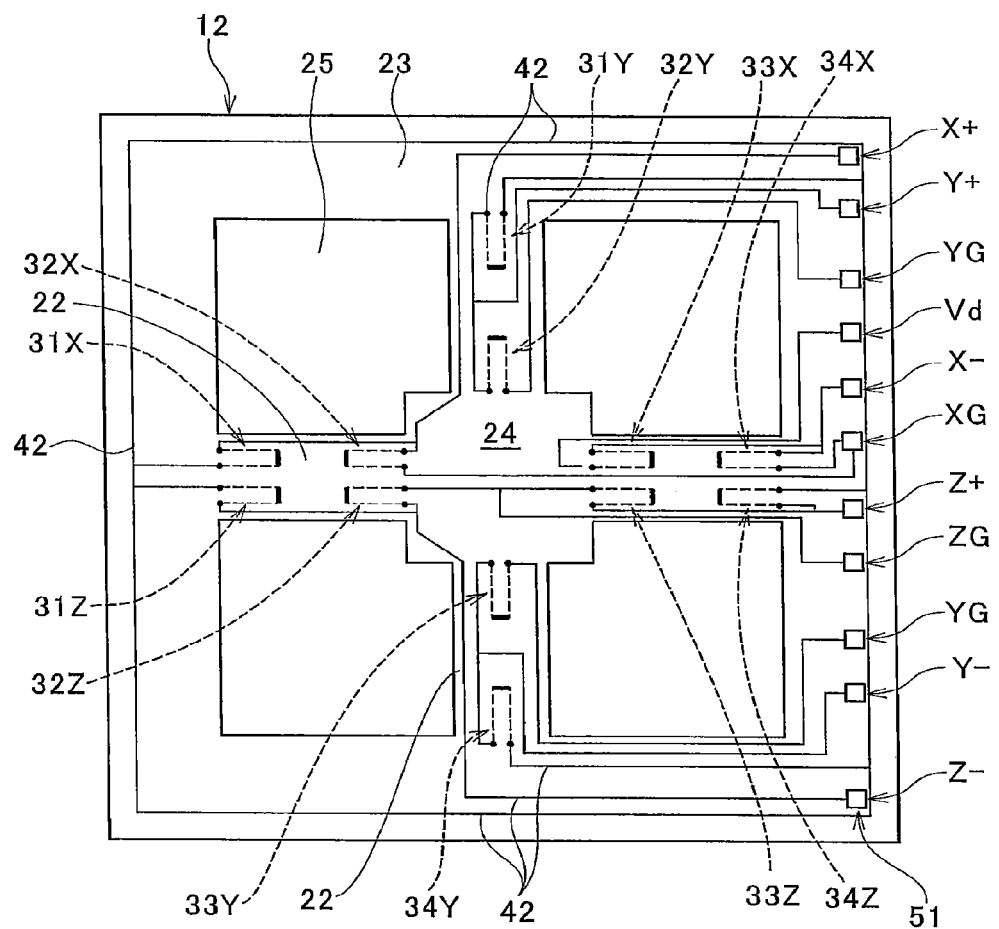
FIG. 11 is a plan view of the sensor, showing one example of the bridge circuit wiring.
Figure 12:
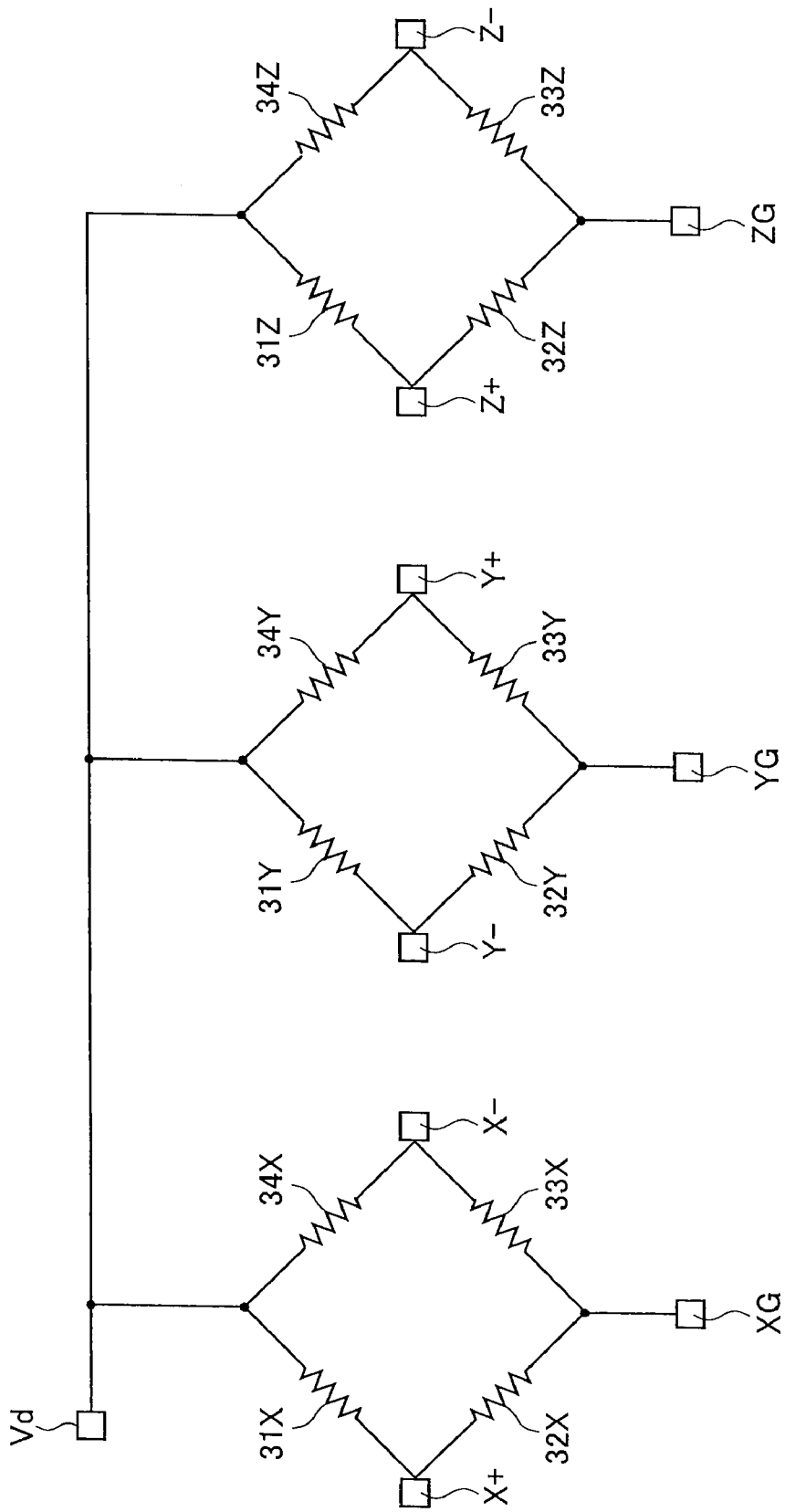
FIG. 12 is a view of one example of the bridge circuit.

FIG. 11 is a plan view of the sensor, showing one example of the bridge circuit wiring 42: it shows only the silicon layer 12 (active layer silicon) forming a part of the sensor body 2. FIG. 12 is illustrative of the thus formed bridge circuit. In the example here, 11 terminals 51 are provided on the right frame 12, and the bridge circuit wiring 42 is located as shown for connection to the given terminals 51 that may be formed of the same metal material as that for the bridge circuit wiring 42 or the like.

With such an inventive sensor, the metal wiring having low electric resistance but high thermal conductivity is located on and connected to the insulating layer positioned at the bend of the piezoelectric-resistor, so that the generation of Joule heat at the bend of the piezoelectric-resistor can be held back, and Joule heat occurring at the piezoelectric-resistor 30 covered with the insulating layer 28 can effectively be released off. Accordingly, the temporal fluctuations in the output values of the sensor can be held back, enabling the sensor to show its own high-sensitivity sensor function in a stable way.

Figure 13:
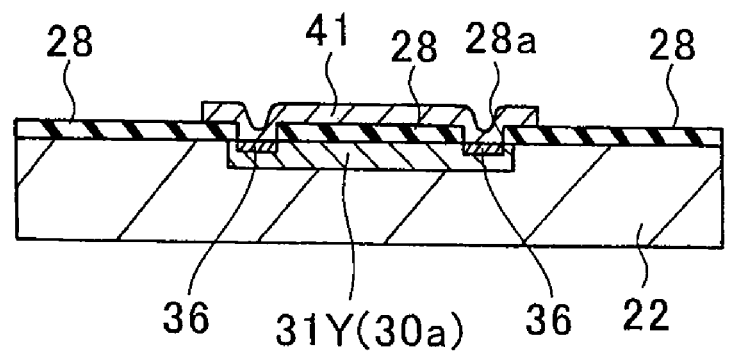
FIG. 13 is a sectional view similar to FIG. 6, showing another embodiment of the inventive sensor.
Figure 14:
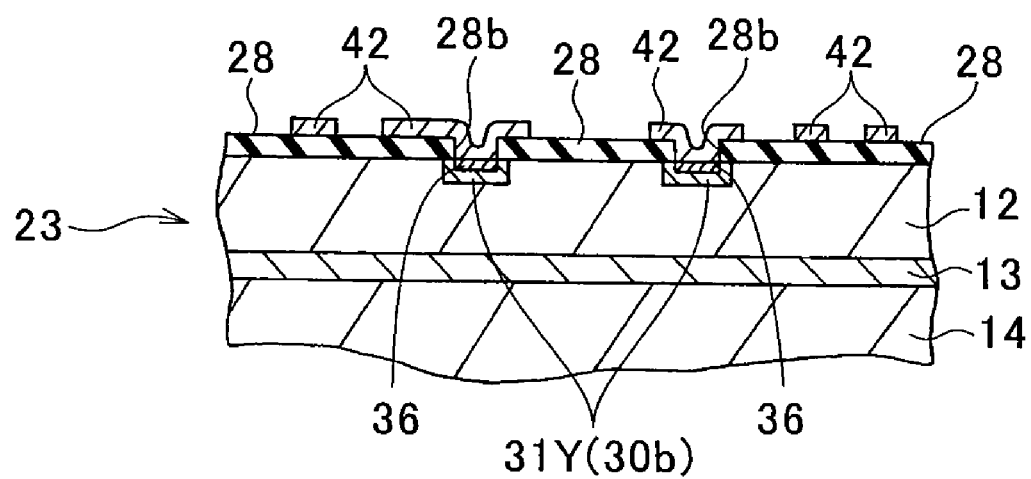
FIG. 14 is a sectional view similar to FIG. 8, showing yet another embodiment of the inventive sensor.

The aforesaid embodiment of the sensor is provided by way of illustration but not by way of limitation. For instance, as shown in FIG. 13, a diffusion resistance layer 36 may be located at the bend 30a of the piezoelectric-resistor 31Y just below the contact holes 28a in the insulating layer 28 or, alternatively, it may be located at both ends 30b of the piezoelectric-resistor 31Y just below the contact holes 28b in the insulating layer 28, as shown in FIG. 14. Such diffusion resistance layer 36 is formed by the diffusion of impurities such as boron, and phosphorus at high concentrations, and has lower resistance than the piezoelectric-resistor 31Y. This enables the contact resistance of the piezoelectric-resistor 31Y with the metal wiring 41, and the bridge circuit wiring 42 to be so reduced that the generation of Joule heat can be held back. Note here that the surface impurity concentration of the diffusion resistance layer 36 is at least one-digit higher than the surface impurity concentration of the piezoelectric-resistor 31Y.

In the invention, the bend 30a of the piezoelectric-resistor 31Y is not a site that contributes to the sensing of physical quantities such as acceleration; in other words, it is not necessarily a low-concentration diffusion layer (for instance, a surface impurity concentration of the order of $10^{17}$ to $10^{19}$ atm/cm$^3$). For instance, when the surface impurity concentration of the bend 30a is about two-digit lower than that of the low-concentration diffusion layer, there is a bit increase in the contact resistance of the piezoelectric-resistor 31Y with the metal wiring 41, and the bridge circuit wiring 42; however, this would not be a significant obstacle to obtaining the advantages of the invention. On the other hand, when the surface impurity concentration of the bend 30a is at least one-digit higher than that of the low-concentration diffusion layer and so the whole bend 30a is similar to the aforesaid diffusion resistance layer 36, it is possible to reduce the contact resistance of the piezoelectric-resistor 31Y with the metal wiring 41, and the bridge circuit wiring 42, thereby keeping Joule heat from occurring.

While, in the above embodiment, one bend is provided, it is understood that there may be two or more such bends provided, and it is usually preferable that an odd number of bends are provided so as to turn both ends of the piezoelectric-resistor in the same direction.

While, in the above embodiment, there are two contact holes provided in the insulating layer at the bend, it is understood that there may be three or more such contact holes provided.

A protective film may further be provided on the sensor body 2 in such a way as to cover the bridge circuit wiring 42. The protective film here may be a thin film formed of silicon nitride, silicon oxide or a multilayer film thereof by means of CVD processes, provided that the metal wiring 41 and terminal 51 remain exposed.

[Sensor Fabrication Process]

One embodiment of the inventive sensor fabrication process is now explained.

How to form the piezoelectric-resistors forming a part of the inventive sensor is first explained typically with reference to the piezoelectric-resistor 31Y of the above sensor 1. FIGS. 15(A) to 15(D) are illustrative of the steps of forming the piezoelectric-resistor, showing a site corresponding to the section depicted in FIG. 6.

At the first step, a film form of resist, silicon oxide, silicon nitride, etc. is formed on the silicon layer 12 (active layer silicon), after which a pattern M is formed by photolithography. Using this pattern M as a mask, impurities such as boron and phosphorus are implanted and diffused into the silicon layer 12 by ion implantation or the like to form the piezoelectric-resistor 31Y having the bend 30a (FIG. 15(A)).

Then, at the second step, the insulating layer 28 is provided in such a way as to cover the piezoelectric-resistor 31Y (FIG. 5(B)). The thus formed insulating layer 28 has two contact holes 28a in the bend 30a of the piezoelectric-resistor 31Y, and the contact holes 28b (not shown) in both ends 30b of the piezoelectric-resistor 31Y. Such insulating layer 28 may be provided by forming a thin film of silicon dioxide, silicon nitride or a multilayer film thereof by means of CVD, PVD or other film-formation technique, then forming a mask pattern by photolithography, and finally forming contact holes by the RIE (reactive ion etching) technique.

Figure 15A:
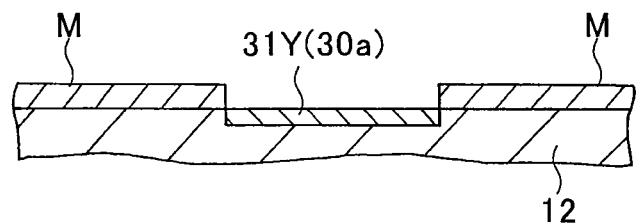
FIGS. 15(A) to 15(D) are illustrative of one example of the inventive sensor fabrication process.
Figure 15B:
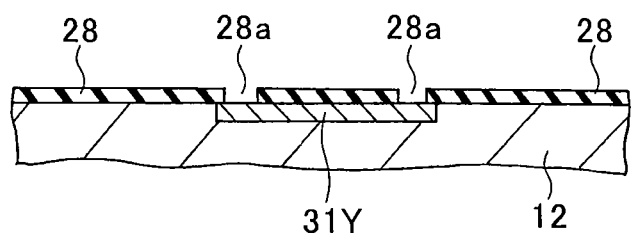
Figure 15C:
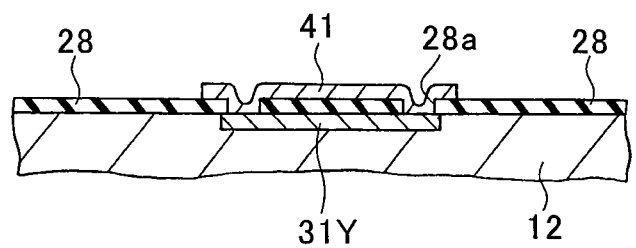

Then, at the third step, the metal wiring 41 is formed on the insulating layer 28 positioned at the bend 30a and, at the same time, the bridge circuit wiring 42 is formed for connection to the piezoelectric-resistor 31Y via the contact holes 28b (not shown) positioned at both ends 30a of the piezoelectric-resistor 31Y (FIG. 15(C)). The metal wiring 41 and bridge circuit wiring 42 may be provided by forming a metal thin film of aluminum or the like on the insulating layer 28, then forming a mask pattern on the metal thin film by photolithography, and finally etching off unnecessary portions. This yields four piezoelectric-resistors 31X, 32X, 33X and 34X for sensing external force in the X-axis direction, four piezoelectric-resistors 31Y, 32Y, 33Y and 34Y for sensing external force in the Y-axis direction, and four piezoelectric-resistors 31Z, 32Z, 33Z and 34Z for sensing external force in the Z-axis direction.

Figure 15D:
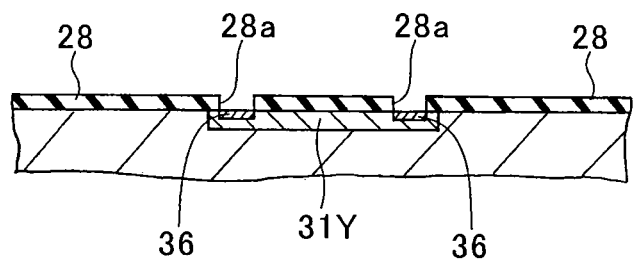

It is here noted that when the diffusion resistance layer 36 is provided on the piezoelectric-resistor 31Y positioned just below the contact holes 28a and just below the contact holes 28b in the insulating layer 28 as shown in FIGS. 13 and 14, it may be formed at the above second step where the insulating layer 28 having the contact holes 28a and 28b is formed, and then using the insulating layer 28 as a mask, high concentrations of impurities such as boron and phosphorus are implanted and diffused into the piezoelectric-resistor 31Y exposed in the contact holes 28a and 28b (FIG. 15(D)). Thus, even with the diffusion resistance layer 36 formed in this way, there is no need of another photolithography step, because the formed insulating layer 28 may be used as a mask.

Figure 16A:
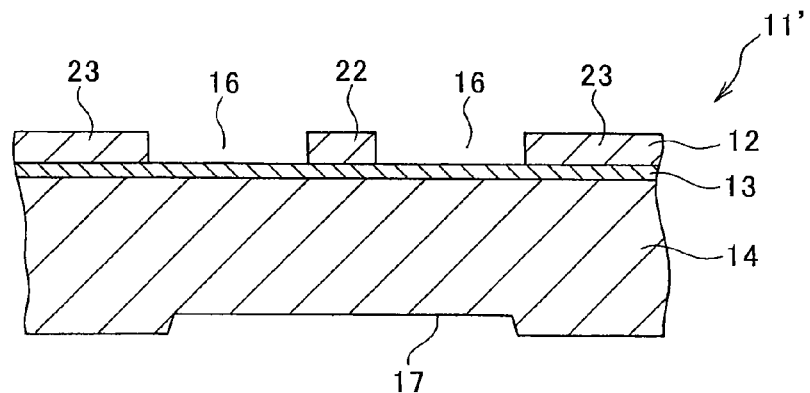
FIGS. 16(A) to 16(C) are illustrative of one example of the inventive sensor fabrication process.
Figure 16B:
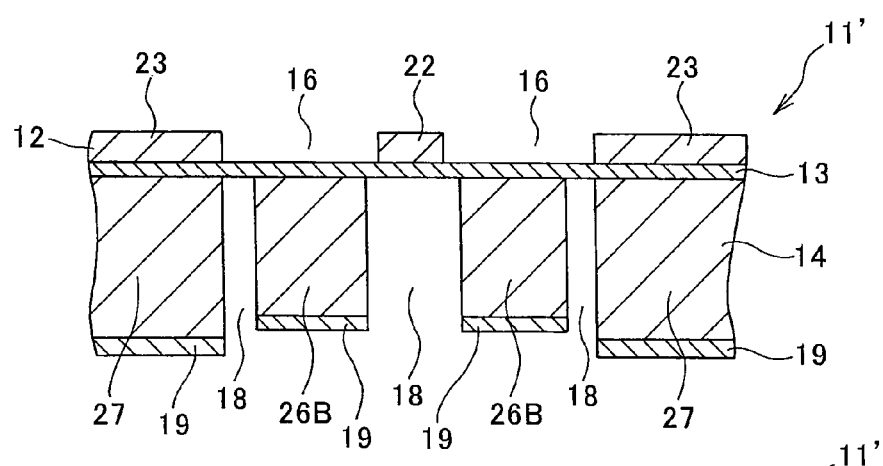
Figure 16C:
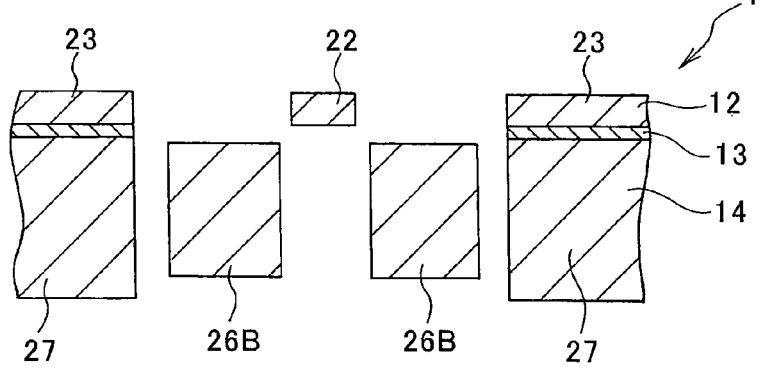

How to form the frame, beams and weight portion forming the inventive sensor is now explained typically with reference to the fabrication of the sensor body 2 of the above sensor 1. FIGS. 16(A) to 16(C) are illustrative of one exemplary fabrication process of the inventive sensor, showing a site corresponding to the sectional shape depicted in FIG. 3.

Referring to FIG. 16(A), a multiplicity of mount surfaces are processed on an SOI wafer 11' having a triple-layer structure of the silicon layer 12 (active layer silicon), silicon oxide layer 13 and silicon layer 14 (substrate silicon). First, sites for forming the beams 22, frame 23 and weight joint 24 are set for each mount surface, and the piezoelectric-resistors (31X to 34X, 31Y to 34Y, and 31Z to 34Z), each having the bend 30a, are formed at given sites of the silicon layer 12 (active layer silicon) that become the beams 22 by means of thermal diffusion, ion implantation or the like. Then, grooves 16 for forming the beam 22, frame 23 and weight joint 24 are formed in the silicon layer 12 (active layer silicon), and a recess 17 for determining the thickness of the weight 26 is provided in the silicon layer 14 (substrate silicon). Such grooves 16 and recess 17, for instance, may be formed by the DRIE (deep reactive ion etching) technique that is a dry etching process using plasma and implemented through a mask pattern. They may also be formed by sand blasting, wet etching, femtosecond laser or other techniques.

Then, for each mount surface, an opening 18 is dug from the silicon layer 14 (substrate silicon) side (or the recess 17 side) of the SOI wafer 11' through a mask pattern 19 until the silicon oxide layer 13 is exposed, thereby forming the weight 26 (having the root 26A and projections 26B) and the frame 27 (FIG. 16(B)). Thereafter, portions of the silicon oxide layer 13 exposed in the openings 18 and grooves 16 are removed off (FIG. 16(C)), whereby the sensor body 2 is obtained. The openings 18 may be formed by the DRIE technique via the mask pattern 19, and removal of the silicon oxide layer 13, for instance, may be implemented by dry etching using reactive gas. By way of example but not by way of limitation, the mask pattern 19 may be formed by photolithography using a photosensitive resist, a process of locating a resin or metal layer and applying direct patterning to it by laser writing, or the like.

No particular limitation is imposed on the order of formation of such frame, beams and weight as forming the sensor and formation of such a piezoelectric-resistor as mentioned above.

Then, the support substrate 3 is bonded to the sensor body 2 having the piezoelectric-resistors formed on it, whereby the above sensor 1 is obtained. Bonding the sensor body 2 to the support substrate 3, for instance, may be implemented by anode bonding, direct bonding, eutectic bonding, and adhesive bonding.

In such an inventive sensor fabrication process as described above, it is the first, the second and the third step that are needed for the formation of the piezoelectric-resistors, and especially at the third step, the metal wiring and the bridge circuit wiring can simultaneously be formed. In other words, the conventional step of diffusing high concentrations of impurities into a silicon substrate for the formation of a high-concentration diffusion layer may be dispensed with. It is thus possible to slash the fabrication costs involved and fabricate a high-performance sensor in a stable way.

It should be noted that the above embodiments are given for the purpose of illustration alone: the invention is never limited to them.

APPLICABILITY TO THE INDUSTRY

The invention may be applied to a variety of fields for which small-format yet high-reliability sensors are needed.

What is claimed is:

1. A sensor, comprising a frame, a plurality of beams extending inwardly from said frame, a weight portion supported by said beams, a piezoelectric-resistor formed on each beam and an insulating layer that covers said piezoelectric-resistor, wherein:

said piezoelectric-resistor has at least one bend forming the resistor in substantially a U shape, a metal wiring is located on said insulating layer positioned at said bend, said metal wiring is connected to said bend via at least two contact holes formed in said insulating layer and at the location of the bend, further contact holes are formed in said insulating layer and are positioned at both ends of said piezoelectric-resistor opposite said bend, and a bridge circuit wiring is connected to the piezoelectric-resistor via said further contact holes.

2. The sensor according to claim 1, wherein a diffusion resistance layer is located at the piezoelectric-resistor just below said contact holes.

3. The sensor according to claim 1, wherein the U shape has two legs and a transverse connection portion at the bend, and wherein the metal wiring is elongated and extends in a direction of elongation of the bend.

* * * * *